United States Patent [19]
Milshtein et al.

[11] Patent Number: 6,023,182
[45] Date of Patent: Feb. 8, 2000

[54] HIGH GAIN PULSE GENERATOR CIRCUIT WITH CLOCK GATING

[75] Inventors: Mark S. Milshtein, Hillsboro; Thomas D. Fletcher; Terry Chappell, both of Portland, all of Oreg.

[73] Assignee: Intel Corporation, Santa Clara, Calif.

[21] Appl. No.: 09/002,148

[22] Filed: Dec. 31, 1997

[51] Int. Cl.$^7$ .............................. H03K 1/04; H03K 3/00
[52] U.S. Cl. ............................................ 327/299; 327/263
[58] Field of Search ................................ 327/31, 36, 122, 327/164–166, 170, 175, 176, 178, 263, 276, 277, 284, 291, 293, 294, 299

[56] References Cited

U.S. PATENT DOCUMENTS

| | | | |
|---|---|---|---|
| 5,059,818 | 10/1991 | Witt et al. .............................. | 327/175 |
| 5,243,637 | 9/1993 | Flaherty et al. ....................... | 377/95 |
| 5,495,194 | 2/1996 | Sugawara ............................... | 327/113 |
| 5,530,387 | 6/1996 | Kim ....................................... | 327/119 |
| 5,548,235 | 8/1996 | Marbot .................................. | 327/158 |
| 5,586,308 | 12/1996 | Hawkins et al. ...................... | 713/501 |
| 5,614,841 | 3/1997 | Marbot et al. ........................ | 326/52 |
| 5,642,068 | 6/1997 | Wojcicki et al. ..................... | 327/172 |
| 5,731,724 | 3/1998 | Grishakov et al. ................... | 327/227 |

*Primary Examiner*—My-Trang Nu Ton
*Attorney, Agent, or Firm*—Antonelli, Terry, Stout & Krauss, LLP

[57] ABSTRACT

A pulse generating circuit includes a first pulse generating circuit for generating a first output pulse, and a second pulse generating circuit for outputting a second output pulse. Each pulse generating circuit comprises a stack of two n-channel transistors and a reset circuit. The reset circuit includes two p-channel transistors and two inverters and is provided for automatically resetting the pulse generating circuits. The second pulse generating circuit includes a delay element for introducing an additional gate delay in the generation of the second output pulse. The additional gate delay introduces an asymmetry in the output pulses which offsets or cancels a previously introduced asymmetry of an input clock signal to generate an output clock signal having a constant period. Clock gating circuitry is provided for selectively enabling and disabling at least one of said pulse generator circuits.

11 Claims, 4 Drawing Sheets

HIGH GAIN PULSE GENERATOR CIRCUIT WITH CLOCK GATING

TECHNICAL FIELD

The present invention relates to clock circuits, and more particularly, to a high gain pulse generator circuit for clocking.

BACKGROUND OF THE INVENTION

One objective in chip performance is to obtain the maximum performance or speed for the least amount of power. Typically, a clock is generated using a phased lock loop (PLL) and then distributed to various circuits on a chip. Not all circuits on a chip are driven by clocks at the same frequency. A significant improvement in system performance can be obtained by increasing the clock frequency that is input to certain circuits, such as the arithmetic logic unit (ALU). For example, while many circuits on a chip may require a clock frequency of 1x, the ALU may require a clock frequency of 2x.

In addition, synchronous circuits require an input clock signal having a fixed or constant period. One period of a clock can be measured, for example as the time period from rising edge to rising edge of the clock signal, or from falling edge to falling edge. However, generating a clock signal having a fixed period can be very difficult.

FIG. 1 illustrates a timing diagram for two clock signals. As illustrated in FIG. 1, a 2x clock signal 7 is generated based on a 1x clock signal 5. The 1x clock signal 5 has a clock period of 14 gate delays, with 7 gate delays for each phase. Therefore, the 1x clock signal 5 has a 50% duty cycle because both phases of the clock cycle are 7 gate delays in width. Two periods of 2x clock signal 7 are generated during one period of the 1x clock signal 5.

Two periods (period 1 and period 2) of the 2x clock signal 7 are illustrated in FIG. 1. For period 1 of the 2x clock signal 7, a rising edge 3 of the 2x clock signal 7 is generated two gate delays after the rising edge of the 1x clock signal 5. Period 1 ends (and period 2 begins) on a rising edge 4 of the 2x clock signal 7, which occurs three gate delays after the falling edge of the 1x clock signal 5. Period 2 of the 2x clock signal 7 ends on a rising edge 8 of the 2x clock signal 7, which occurs two gate delays after the rising edge of the 1x clock signal 5.

The 2x clock signal 7 does not have a constant period clock because of an odd/even gate delay problem. An even number of gate delays are typically required to generate a rising edge (e.g., rising edge 3) from a rising edge. Also, an odd number of gate delays are typically required to generate a rising edge (e.g., rising edge 4) from a falling edge. In the example illustrated in FIG. 1, the rising edge 3 of the 2x clock signal 7 is delayed by two gate delays from the rising edge of the 1x clock signal 5. However, the rising edge 4 of the 2x clock signal 7 is delayed by three gate delays from the falling edge of the 1x clock signal 5. As a result, period 1 of the 2x clock signal 7 is eight gate delays wide, and period 2 is six gate delays wide. Therefore, the period of 2x clock signal 7 is not constant, which is unacceptable for a clock signal for synchronous circuits.

In the past, chip manufacturers have attempted to obtain a fixed period clock by adjusting the gate delays for selected transistors. However, this technique is very difficult to successfully implement and adds significant complexity to the chip design and semiconductor processing.

In addition, many prior art clock circuits used complementary metal oxide semiconductor (CMOS) static networks to generate clock signals. However, CMOS networks employ both n-channel and p-channel transistors for each inversion. As a result, these clock circuits have a high input capacitance, resulting in a low capacitive gain and requiring large devices to generate sufficient current. Also, the complementary (n-channel and p-channel) transistors of a CMOS network are turned on together at the same time during switching, thereby requiring even additional current. It is desirable to have clock circuits having a higher capacitive gain and requiring less current than the CMOS static networks.

Therefore, there is a need for a clock circuit that more efficiently generates a 2x clock signal having a constant clock period while improving capacitive gain.

SUMMARY

The pulse generator circuit according to an embodiment of the present invention overcomes the disadvantages of the prior art by including a first and second pulse generator circuits. The first pulse generator circuit receives a reference clock as an input and outputs a first pulse in response to a rising edge of the reference clock. The second pulse generator circuit is coupled to the first pulse generator circuit and receives the reference clock as an input and outputs a second pulse in response to a falling edge of the reference clock. A delay circuit is coupled to the pulse generator circuits and delays one of the output pulses to generate a constant period clock signal. Clock gating circuitry is also provided for selectively enabling and disabling at least one of the pulse generator circuits.

DETAILED DESCRIPTION

Figure 1:
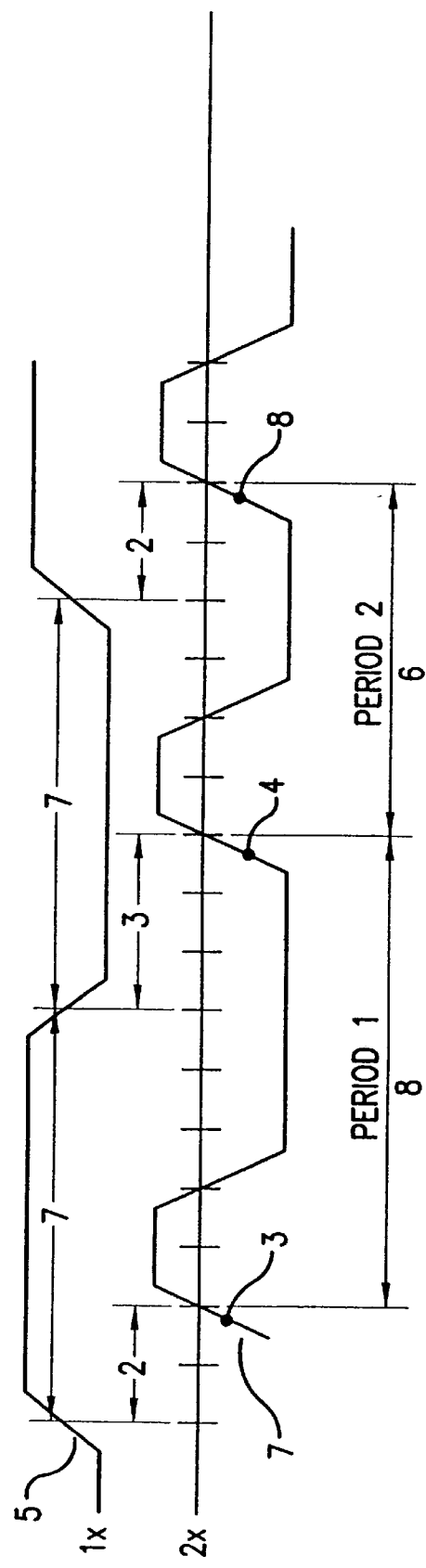
FIG. 1 illustrates a timing diagram for two clock signals.
Figure 2:
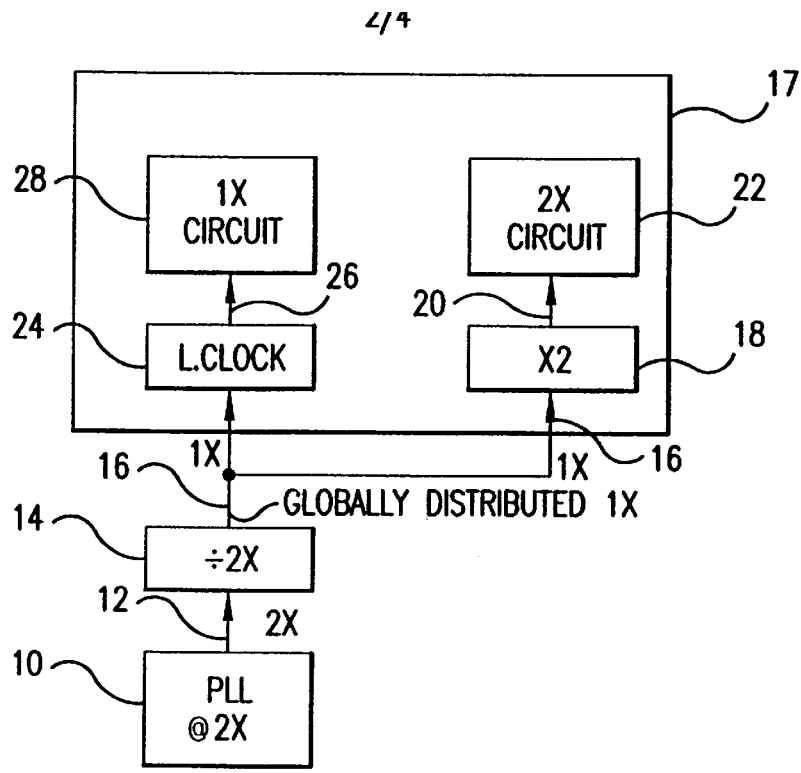
FIG. 2 illustrates a clock generation circuit according to an embodiment of the present invention.

Referring to the drawings in detail, wherein like numerals indicate like elements, FIG. 2 illustrates a clock generation circuit according to an embodiment of the present invention. A phased lock loop (PLL) 10 generates a clock signal 12 at a 2x frequency. A frequency divider circuit 14 divides the 2x clock signal 12 and generates a 1x clock signal 16. The 1x clock signal is globally distributed to a chip 17. For example, the 2x clock frequency could be at 100 MHZ, and the 1x clock signal could be at 50 MHZ. Chip 17 includes two circuits which require clock signals at different speeds. A 1x circuit 28 requires a 1x clock signal, and a 2x circuit 22 requires a 2x clock signal. The 2x circuit can be, for example, portions of an ALU, that require the faster 2x clock speed. Alternatively, frequency divider circuit 14 and PLL 10 can be located on chip 17.

The 1x clock signal 16 is input to pulse generator circuits 18 and 24. Pulse generator circuit 18 generates a 2x clock signal 20 based on the 1x input clock signal 16. Pulse generator circuit 18 therefore operates as a frequency doubler. The pulse generator circuit 24 is a local clock circuit and outputs a clock signal at the 1x frequency to 1x circuit 28. The local clock circuit 24 is required to maintain synchronization between the 1× clock signal 26 and the 2× clock signal 20.

Figure 3:
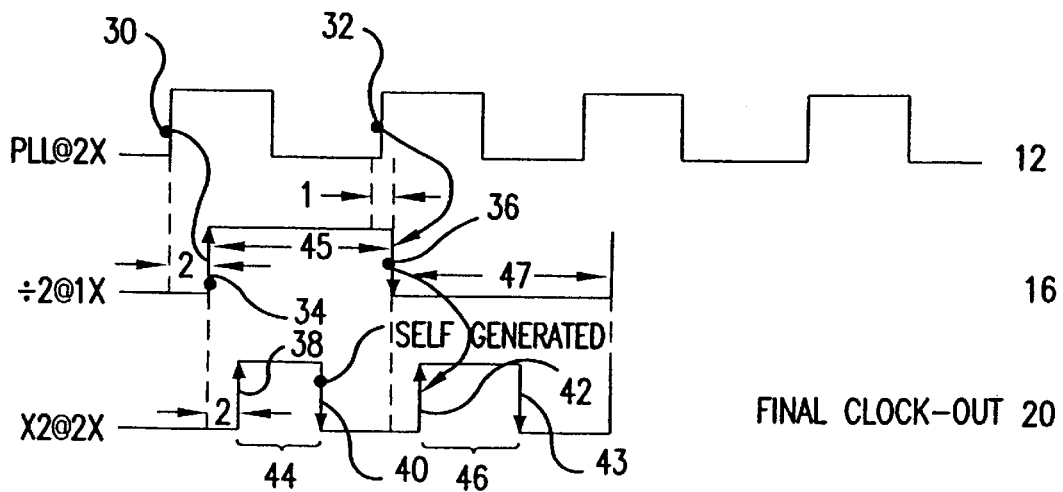
FIG. 3 illustrates a timing diagram for the clock generation circuit of FIG. 1.

FIG. 3 illustrates a timing diagram for the clock generation circuit of FIG. 2 according to an embodiment of the present invention. In FIG. 3, the timing diagrams are illustrated for the 2× clock signal 12 output by the PLL 10, the 1× clock signal 16 output from the frequency divider circuit 14, and the 2× clock signal 20 output from the pulse generator circuit 18. The 2× clock signal 12 is a constant period clock signal, and can have a 50% duty cycle. The rising edge 34 of the 1× clock signal 16 is generated two gate delays after and in response to the rising edge 30 of the 2× clock signal 12. The falling edge 36 of the 1× clock signal 16 is generated one gate delay after and in response to the rising edge 32 of the 2× clock signal 12. One cycle (or period) of the 1× clock signal 16 includes two phases, a first phase 45 and a second phase 47. Note that the phases (45 and 47) of 1× clock signal 16 are asymmetric by one gate delay. Phase 47 is one gate delay wider than phase 45. This is due to the odd/even gate delay problem in which rising edges of the 2× clock signal 12 must be used to generate both falling and rising edges of the 1× clock signal 16.

Pulse generator circuit 18 generates two output pulses during each cycle of the 1× clock signal 16. Pulse generator circuit 18 generates a first output pulse 44 during the first phase 45 of the 1× clock signal 16 and a second output pulse 46 during the second phase 47 of the 1× clock signal 16.

The rising edge 38 of the 2× clock signal 20 is generated two gate delays after and in response to the rising edge 34 of the 1× clock signal 16. The falling edge 40 of clock signal 20 is self-generated and creates a pulsed output. The rising edge 42 is generated three gate delays after and in response to the falling edge 36 of the 1× clock signal 16. The falling edge 43 of the second output pulse 46 is also self-generated.

Therefore, it can be seen that the first output pulse 44 of clock signal 20 is generated two gate delays after the edge 34 of the 1× clock signal 16, whereas the second output pulse 46 is generated three gate delays from the edge 36 of the 1× clock signal 16. As a result, the first and second output pulses 44 and 46 are generated asymmetrically (or unevenly) by one gate delay with respect to the 1× clock signal 16. However, the asymmetric generation of the 2× clock signal 20 is designed to offset the asymmetric generation of the 1× clock signal 16 to recreate a 2× clock signal having a constant period.

According to an embodiment of the present invention illustrated in FIG. 3, the first output pulse 44 is delayed two gate delays from the rising edge 34 of the 1× clock signal 16, and delayed two additional gate delays from rising edge 30 of the 2× clock signal 12. Therefore, the first output pulse 44 is delayed a total of four gate delays from the rising edge 30 of the 2× clock signal 12 output from the PLL 10. Similarly, the second output pulse 46 is delayed three gate delays from the edge 36 of the 1× clock signal 16, and one additional gate delay from the edge 32 of the 2× clock signal 12. Therefore, the second output pulse 46 of the 2× clock signal 20 is also delayed a total of four gate delays from the rising edge 32 of the 2× clock signal from the PLL 10. Because the two and two gate delays of the first output pulse 44 offset the three and one gate delays of the second pulse 46, the 2× clock signal 20 output from the pulse generator circuit 18 has a constant clock period. The gate delays shown in FIG. 3 are provided merely as an example. Other numbers can be used.

Therefore, according to an embodiment of the present invention, the natural one gate asymmetry in the generation of 2× clock signal 20 (with respect to the 1× clock signal 16) is used to offset the natural one gate asymmetry in the generation of the 1× clock signal 16 to achieve a 2× clock signal 20 having a constant period.

Figure 4:
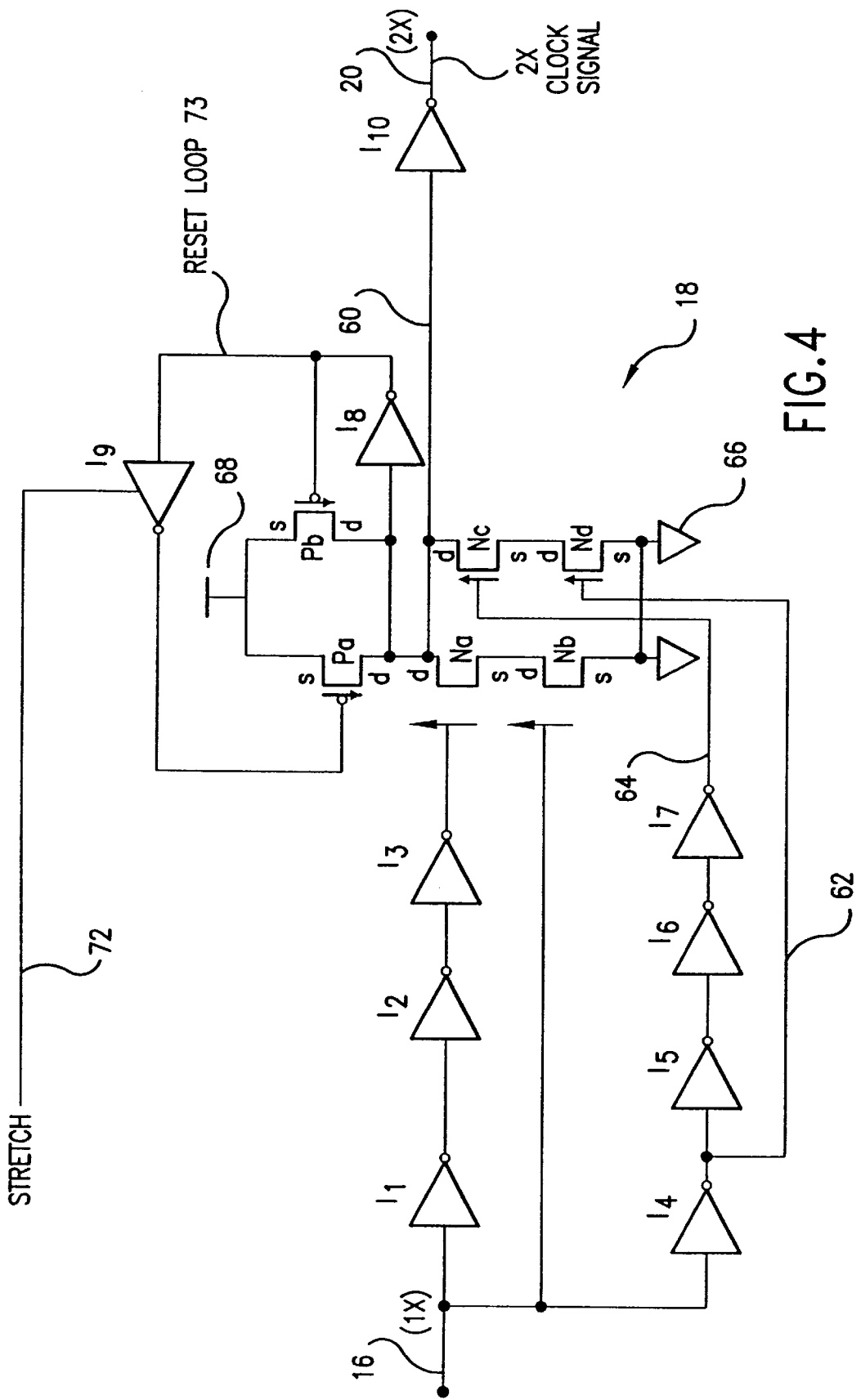
FIG. 4 illustrates pulse generator circuit according to an embodiment of the present invention.

FIG. 4 illustrates a pulse generator circuit according to an embodiment of the present invention. The pulse generator circuit 18 of FIG. 4 receives the 1× clock signal 16 as an input, and outputs the 2× clock signal 20. Pulse generator circuit 18 includes three inverters in series I1, I2, and I3. I1 is coupled to the 1× clock signal 16. A second set of inverters that are placed in series include 14, I5, I6 and I7. I4 also receives the 1× clock signal 16 as an input. The pulse generator circuit 18 includes a first stack of n-channel transistors that includes transistors Na and Nb, and a second stack of n-channel transistors that includes transistors Nc and Nd. The gate of transistor Na is connected to the output of inverter I3, and the gate of transistor Nb is connected to the 1× clock signal 16. The output 62 of inverter I4 is connected to the gate of transistor Nd, and the output 64 of inverter I7 is connected to the gate of transistor Nc.

The drains of transistors Na and Nc are both connected to output signal 60. The source of transistor Na is connected to the drain of transistor Nb. The source of transistor Nc is connected to the drain of transistor Nd. The sources of Nb and Nd are connected to a pull-down voltage source 66 (such as ground). The output signal 60 is connected to an input of an inverter I10 which outputs the 2× clock signal 20.

The pulse generator circuit 18 also includes two p-channel transistors, transistors Pa and Pb. The sources of transistors Pa, and Pb are both connected to pull-up voltage source 68, which may be 1.8 or 2.5 volts, for example. The drains of transistors Pa and Pb are both connected to output signal 60. An inverter I8 is connected between the drains of transistors Pa and Pb and the gate of transistor Pb. An inverter I9 is connected between the gate of transistor Pb and the gate of transistor Pa. Inverters I8 and I9 (along with transistors Pa and Pb) form a reset loop 73 from the output signal 60 to the gates of transistors Pb and Pa. This reset loop 73 is provided for automatically resetting the pulse generator circuit 18. A stretch signal 72 is input to inverter I9 for adjusting the pulse widths of the first output pulse 44 and the second output pulse 46.

The operation of the pulse generator circuit 18 of FIG. 4 will now be described. The pulse generator circuit 18 can be described as including two pulse generating circuits. A first pulse generating circuit generates the first output pulse 44 of the 2× clock signal 20, and a second pulse generating circuit generates the second output pulse 46 of the 2× clock signal 20. These two pulse generating circuits generally operate independently of one another and will be described separately below.

The first pulse generating circuit includes inverters I1, I2 and I3, the first stack of n-channel transistors that includes transistors Na and Nb, and the components of reset loop 73 including p-channel transistors Pa and Pb and inverters I8 and I9, and inverter I10. Inverter I10 could be a static CMOS inverter, a dynamic inverter, a reset assist inverter, or the like. As will be described in greater detail below, the first stack of n-channel transistors Na and Nb respond to the 1× clock signal 16 and generate the rising edge 38 (FIG. 3) of the first output pulse 44, while p-channel transistors Pa and Pb respond to a change in the output signal 60 and generate the falling edge 40 of the first output pulse 44.

Initially the 1× clock signal 16 is low and transistor Nb is off (not conducting), transistor Na is on (conducting), transistor Nd is on, and transistor Nc is off. The output signal 60 is initially high, which creates a low on the output of inverter I8, which turns on p-channel transistor Pb, thereby reinforcing the high level on the output signal 60. Therefore, transistor Pb can be referred to as a keeper transistor because it keeps or reinforces the high level on output signal 60. The low input to inverter I9 from inverter I8 creates a high level input to the gate of p-channel transistor Pa, thereby turning off transistor Pa. As used herein, a transistor is turned off when it is fully non-conducting.

At time t=0, the 1× clock signal 16 from the frequency divider 14 transitions from a low to high level, shown as rising edge 34 in FIG. 3. One gate delay after the 1× clock signal 16 goes high, transistor Nb turns on, which pulls down the output signal 60 from a high level to a low level. (As used herein, the term "turns on" refers to the fully conducting state of the transistor.) This creates the rising edge 38 of the first output pulse 44 of the 2× clock signal 20 one gate delay later (due to inverter I10). Note that keeper transistor Pb is a relatively small device. Therefore the current from the larger transistor Nb overcomes transistor Pb to pull down the output signal 60 to a low level.

Therefore, it can be seen that the rising edge 38 of 2× clock signal 20 is generated 2 gate delays after and in response to the rising edge 34 of the 1× clock signal 16. The first gate delay results from the gate delay for transistor Nb to turn on. The second gate delay results from inverter I10 switching.

The low level on output signal 60 creates a high level on the gate to p-channel transistor Pb due to inverter I8. This high on the gate of transistor Pb turns off transistor Pb three gate delays after the rising edge 34 of the 1× clock signal 16 (including the 1 gate delay for Pb to switch to a fully non-conducting or off state). In addition, the high on the output of inverter I8 creates a low on the output of inverter I9, thereby turning on p-channel transistor Pa four gate delays after the rising edge 34 of 1× clock signal 16 (including one gate delay for Pa to switch to a fully conducting or on state). Also, the high on the 1× clock signal 16 ripples through inverters I1, I2 and I3 to create a low level on the gate of transistor Na, thereby turning off transistor Na four gate delays after the rising edge 34 of 1× clock signal 16. The combination of transistor Pa turning on and transistor Na turning off pulls up the output signal 60 to a high level. Transistor Pa can be referred to as a pre-charge transistor because when transistor Pa is turned on, Pa pre-charges or pulls up the output signal 60 to a high level. Due to inverter I10, the low-to-high transition on the output signal 60 creates the falling edge 40 in the first output pulse 44 of the 2× clock signal 20.

After having generated the first output pulse 44, the first pulse generating circuit automatically resets itself through the reset loop 73. The high level on the output signal 60 creates a low on the gate of p-channel transistor Pb (due to inverter I8), thereby turning on transistor Pb and reinforcing the high on the output signal 60. The low on the output of inverter I8 creates a high on the output of inverter I9 thereby turning off p-channel transistor Pa. By turning on transistor Pb and turning off transistor Pa, these transistors are reset to their original state due to the reset loop 73.

It should be noted that transistors Nc and Nd do not interfere with the operation of the first pulse generating circuit because initially transistor Nc is off and transistor Nd turns off before transistor Nc turns on. This allows the state of output signal 60 to be determined by transistors Na, Nb, Pa and Pb.

The second pulse generating circuit generates the second output pulse 46 of the 2× clock signal 20. The second pulse generating circuit includes inverters I4, I5, I6 and I7, the second stack of n-channel transistors Nc and Nd, p-channel transistors Pa and Pb and inverters I8, I9 and I10. Therefore, transistors Pa and Pb, and inverters I8–I10 are common to the first and second pulse generating circuits. Initially, the 1× clock signal 16 is at a high level, transistor Nb is on, transistor Nd is off, transistor Nc is on, transistor Na is off, the output signal 60 is high, transistor Pb is on and transistor Pa is off. The high on output signal 60 is maintained by keeper transistor Pb.

At time t=0, the 1× clock signal 16 goes to a low level, represented in FIG. 3 as the falling edge 36. The low on the 1× clock signal 16 creates a high one gate delay later on the output 62 of inverter I4 which is input to the gate of n-channel transistor Nd. The high on the gate of transistor Nd causes transistor Nd to turn on and one gate delay later the output signal 60 is pulled low. This creates the rising edge 42 of the second output pulse 46 of 2× clock signal 20 one gate delay after signal 60 falls (due to inverter I10).

Therefore, it can be seen that the rising edge 42 (FIG. 3) of the 2× clock signal 20 is generated three gate delays after and in response to the falling edge 36 of the 1× clock signal 16. A first gate delay caused by inverter I4. Inverter I4 may be considered a delay element or delay circuit because inverter I4 introduces an additional gate delay not found in the first pulse generating circuit. Inverter I4 is responsible for the asymmetric or uneven generation of the first and second output pulses 44 and 46. The second gate delay for the second pulse generation circuit is caused by transistor Nd. The third gate delay results from inverter I10. This two-three asymmetry introduced in the generation of the output pulses of the 2× clock signal 20 is used to offset the two-one gate delay asymmetry that was introduced in the generation of the 1× clock signal 16 to cause the 2× clock signal 20 to have a constant period.

The low on the output signal 60 creates a high on the output of inverter I8, thereby turning off transistor Pb four gate delays after the falling edge 36 of 1× clock signal 16. The high on the output of inverter I8 creates a low that is input to the gate of p-channel transistor Pa. This low on the gate of transistor Pa turns on transistor Pa five gate delays after the falling edge 36 of the 1× clock-in signal 16. By turning on transistor Pa, output signal 60 is pulled to a high level, thereby generating the falling edge 43 of the second output pulse 46 of the 2× clock signal 20. Falling edge 43 of 2× clock signal 20 is self-generated by the second pulse generating circuit.

After having generated the second output pulse 46, the second pulse generating circuit automatically resets itself through the reset loop 73. The high on the output signal 60 generates a low on the output of inverter I8 thereby turning on transistor Pb seven gate delays after the falling edge 36 of the 1× clock signal 16 and reinforcing the high on the output signal 60. The low on the output of inverter I8 creates a high on the gate of p-channel transistor Pa, thereby turning off transistor Pa eight gate delays after the falling edge 36 of the 1× clock signal 16. By turning on transistor Pb and turning off transistor Pa, these transistors are reset to their original state, due to the reset loop 73.

It should be noted that transistors Na and Nb do not interfere with the operation of the second pulse generating circuit because transistor Na is initially off and transistor Nb turns off before transistor Na turns on. This allows the state of output signal 60 to be determined by transistors Nc, Nd, Pa and Pb.

To adjust the pulse width of the first and/or second output pulses, a stretch signal 72 is input to inverter I9. The pull down portion of inverter I9 is programmable to be faster or slower based on the voltage applied on stretch signal 72. The stretch signal 72 allows inverter I9 to switch at a slower or a faster speed, depending on whether the pulse width will be increased or decreased.

In contrast to many prior art clock circuits that employed CMOS circuits that require high current and have a low capacitive gain, the n-channel transistors Na, Nb, Nc, and Nd according to an embodiment of the present invention are dynamic self-resetting, domino type circuits that do not include complementary p-channel transistors. As a result the capacitive gain of the pulse generator circuit 18 of the present invention is greatly increased and the required current is decreased. Moreover, the use of the dynamic, domino type circuits of the present invention eliminate the overlap current between complementary p and n-channel devices required by the CMOS clock circuits. This allows smaller devices to be used in the clock circuits to generate the same amount of output current thereby providing even greater efficiency.

Figure 5:
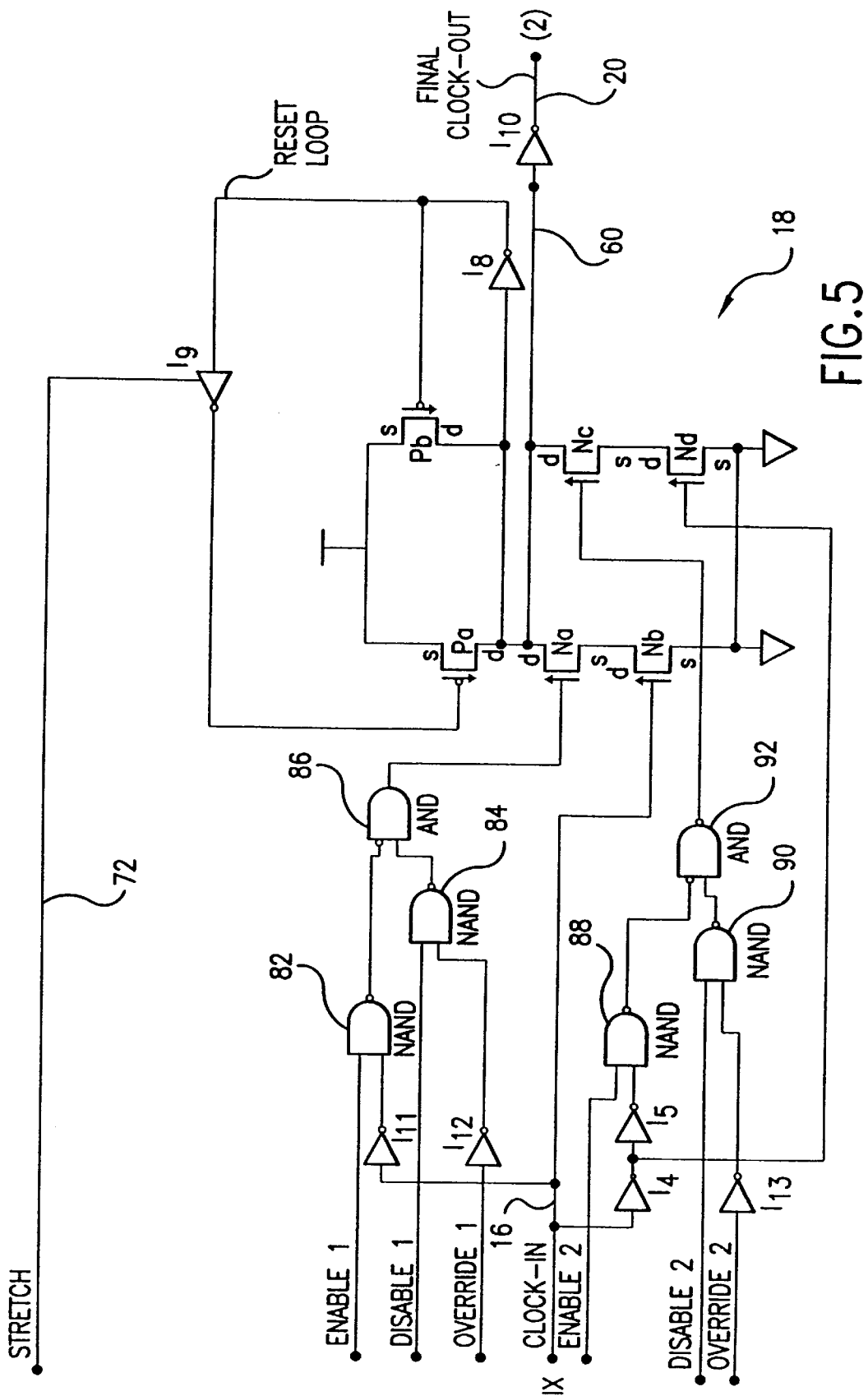
FIG. 5 illustrates a pulse generator circuit according to another embodiment of the present invention.

FIG. 5 illustrates a pulse generating circuit according to an embodiment of the present invention. Instead of using a plurality of series inverters (as used in FIG. 4), the pulse generating circuit of FIG. 5 uses combinatorial logic to provide clock gating circuitry to enable or disable each of the first and second pulse generating circuits. A Nand gate 82 receives an enable 1 input signal. Inverter I11 receives the 1× clock signal 16 and outputs a signal to Nand gate 82. An inverter I12 receives an override1 signal and has an output connected to a Nand gate 84. A disable1 signal is also input to the Nand gate 84. Nand gate 84 has an output connected to And gate 86. The output of Nand gate 82 is input to an inverter and then to And gate 86. The output from And gate 86 is input to the gate of n-channel transistor Na. A Nand gate 88 receives an enable2 signal and the output of inverter I5. An inverter I13 receives an override2 signal and outputs a signal to a Nand gate 90. Nand gate 90 also receives an input from a disable2 signal and outputs a signal to an And gate 92. The output of Nand gate 88 is passed to an inverter and then input to And gate 92. The output of And gate 92 is input to the gate of n-channel transistor Nc. The remainder of the circuit of FIG. 5 is the same as that of FIG. 4.

The clock gating circuitry of FIG. 5, which comprises the Nand gates, And gates and the inverters, allows the first and second pulse generation circuits to be selectively enabled and disabled. The first pulse generator circuit can be enabled and disabled based on the enable1, disable1 and the override1 signals. Similarly, the second pulse generator circuit can be enabled and disabled based upon the enable2, disable2 and override2 signals. According to the embodiment illustrated in FIG. 5, the pulse generating circuits are enabled when the enable signals are high, the disable signals are low, and the override signals are high. Otherwise the pulse generator circuits will be disabled and will not generate the output pulses.

The clock gating circuitry can be used, for example, for power control to halt the generation of the 2× clock signal 20 that is delivered to a specific portion of a chip such as an arithmetic logic unit (ALU). A portion of a chip may be halted in a power saving or sleep mode and the clocks input to the chip disabled in order to conserve power.

The pulse generating circuit 18 according to an embodiment of the present invention includes a first pulse generating circuit for generating a first output pulse 44, and a second pulse generating circuit for outputting a second output pulse 46. Each pulse generating circuit comprises a stack of two n-channel transistors (Na and Nb, or Nc and Nd), and a reset loop 73. The reset loop 73 includes two p-channel transistors Pa and Pb and two inverters I8 and I9, and is provided for automatically resetting the pulse generating circuits. The n-channel transistors respond to a 1× clock signal input to the circuit to generate a first edge of each output pulse. The p-channel transistors Pa and Pb respond to a change in the output of the pulse generator circuit to generate a second edge of each output pulse. The second pulse generating circuit includes a delay element 14 for introducing an additional gate delay in the generation of the second output pulse 46. The additional gate delay in the second output pulse creates an asymmetry that offsets or cancels an asymmetry previously introduced by a frequency divider circuit in order to generate a 2× clock signal having a constant period. The pulse generator circuit 18 can include clock gating circuitry for selectively enabling or disabling the first and second pulse generator circuits. In addition, the circuits used in the pulse generator circuit 18 of the present invention are dynamic, domino type circuits that have a high capacitive gain and require less current than standard CMOS circuits.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A pulse generator circuit comprising:
   a first pulse generator circuit receiving a reference clock as an input and outputting a first pulse in response to a rising edge of the reference clock;
   a second pulse generator circuit coupled to the first pulse generator circuit and receiving as an input the reference clock, the second pulse generator circuit outputting a second pulse in response to a falling edge of the reference clock;
   one of said pulse generator circuits including a delay circuit coupled thereto and delaying one of the output pulses to generate a constant period clock signal; and
   clock gating circuitry coupled to said pulse generator circuits, said clock gating circuitry selectively enabling and disabling at least one of said pulse generator circuits.

2. The pulse generator circuit of claim 1 wherein said first and second pulse generator circuits include a reset circuit coupled to the pulse generator circuits, said reset circuit resetting each of the pulse generator circuits after each pulse generator circuit outputs one of the pulses.

3. The pulse generator circuit of claim 1 wherein said first pulse generator circuit comprises:
   a plurality of inverters in series, a first of the inverters receiving the reference clock signal as an input;
   a first group of transistors generating a first edge of the first output pulse in response to the rising edge of the reference clock input signal; and
   a second group of transistors coupled to the first group of transistors, the second group of transistors generating a second edge of the first output pulse in response to a change in the output of the first pulse generator circuit.

4. The pulse generator circuit of claim 3 wherein said first group of transistors comprises a stack of two N-channel transistors connected in series between the output of the first pulse generator circuit and ground, a gate of one of the N-channel transistors receiving the reference clock as an input.

5. The pulse generator circuit of claim 3 wherein said second group of transistors comprise:
   a keeper transistor keeping the output of the first pulse generator circuit at a predetermined voltage;
   a precharge transistor coupled in parallel with the keeper transistor.

6. The pulse generator circuit of claim 1 wherein said second pulse generator circuit comprises:
   a plurality of inverters in series, a first of the inverters receiving the reference clock signal as an input;
   a first group of transistors generating a first edge of the second output pulse in response to the falling edge of the reference clock input signal; and
   a second group of transistors coupled to the first group of transistors, the second group of transistors generating a second edge of the second output pulse in response to a change in the output of the second pulse generator circuit.

7. The pulse generator circuit of claim 6 wherein said first group of transistors comprises a stack of N-channel transistors connected in series between the output of the second pulse generator circuit and ground.

8. The pulse generator circuit of claim 6 wherein said second group of transistors comprise:
   a keeper transistor keeping the output of the second pulse generator circuit at a predetermined voltage;
   a precharge transistor coupled in parallel with the keeper transistor.

9. The pulse generator circuit of claim 1, wherein said first pulse generator circuit comprises:
   a first group of transistors generating a first edge of the first output pulse in response to the rising edge of the reference clock input signal; and
   a second group of transistors coupled to the first group of transistors, the second group of transistors generating a second edge of the first output pulse in response to a change in the output of the first pulse generator circuit; and
   wherein the second pulse generator circuit comprises:
      a third group of transistors generating a first edge of the second output pulse in response to the falling edge of the reference clock input signal; and
      the second group of transistors coupled to the third group of transistors and generating a second edge of the second output pulse in response to a change in the output of the second pulse generator circuit.

10. The pulse generator circuit of claim 1 wherein the output of the first pulse generator circuit is connected to the output of the second pulse generator circuit.

11. A pulse generator circuit comprising:
   means for outputting a first pulse in response to a rising edge of a reference clock;
   means for outputting a second pulse in response to a falling edge of the reference clock;
   means for delaying one of the output pulses;
   means for resetting each of the pulse outputting means; and
   means for selectively enabling and disabling at least one of the pulse outputting means.

* * * * *